United States Patent
Kiefer et al.

(10) Patent No.: US 8,022,603 B2
(45) Date of Patent: Sep. 20, 2011

(54) PIEZOELECTRIC ACTUATOR

(75) Inventors: Joachim R. Kiefer, Losheim am See (DE); Joachim Vendulet, Niederkirchen (DE)

(73) Assignee: Delphi Technologies Holding S.arl, Troy, MI (US)

( * ) Notice: Subject to any disclaimer, the term of this patent is extended or adjusted under 35 U.S.C. 154(b) by 37 days.

(21) Appl. No.: 12/223,910

(22) PCT Filed: Feb. 14, 2007

(86) PCT No.: PCT/IB2007/001668
§ 371 (c)(1),
(2), (4) Date: Jul. 2, 2010

(87) PCT Pub. No.: WO2007/119174
PCT Pub. Date: Oct. 25, 2007

(65) Prior Publication Data
US 2010/0264780 A1    Oct. 21, 2010

(30) Foreign Application Priority Data
Feb. 14, 2006    (GB) .................................. 0602955.7

(51) Int. Cl.
*H01L 41/16*    (2006.01)

(52) U.S. Cl. ........................................................ 310/340
(58) Field of Classification Search .................. 310/340
See application file for complete search history.

(56) References Cited

U.S. PATENT DOCUMENTS

| | | | |
|---|---|---|---|
| 6,359,373 B1 * | 3/2002 | Buckley et al. | 310/328 |
| 6,700,308 B2 * | 3/2004 | Heinz | 310/328 |
| 6,930,438 B2 * | 8/2005 | Cramer et al. | 310/328 |
| 7,268,468 B2 * | 9/2007 | Schoor | 310/328 |
| 2002/0084723 A1 * | 7/2002 | Kawazoe | 310/348 |
| 2005/0046310 A1 * | 3/2005 | Kobayashi et al. | 310/328 |
| 2010/0031929 A1 * | 2/2010 | Capellmann et al. | 123/472 |
| 2010/0163650 A1 * | 7/2010 | Heinz et al. | 239/533.2 |
| 2010/0180865 A1 * | 7/2010 | Vendulet et al. | 123/472 |

FOREIGN PATENT DOCUMENTS
DE    3024030 A * 1/1982
JP    60255427 A * 12/1985

* cited by examiner

Primary Examiner — Thomas M Dougherty
(74) Attorney, Agent, or Firm — Thomas N. Twomey

(57) ABSTRACT

A piezoelectric actuator (2) comprising a stack of one or more piezoelectric elements (4) defining an external surface, and passivation means (20) applied to the external surface of the stack, wherein the passivation means (20) includes a self-supporting polyimide material (20b) (e.g. in the form of a layer, film or membrane).

6 Claims, 3 Drawing Sheets

PIEZOELECTRIC ACTUATOR

TECHNICAL FIELD

The invention relates to a piezoelectric actuator suitable for use in a fuel injector of an internal combustion engine. In particular, the invention relates to a means for encapsulating the piezoelectric actuator to protect it against damage.

BACKGROUND TO THE INVENTION

Known piezoelectric fuel injectors typically employ piezoelectric actuators made from a stack of a plurality of piezoelectric ceramic discs or plates each connected to an electrode for electrically charging and discharging the stack. The actuator is mechanically arranged for opening and closing an injector valve having a valve needle to meter fuel injected into the engine. In some injectors, the piezoelectric actuator is located in a chamber containing fuel—usually diesel, biodiesel or gasoline—pressurised up to 2000 bar. An example of a piezoelectric fuel injector is disclosed in the applicant's U.S. Pat. No. 6,520,423, which utilises a hydraulic coupling arrangement to lift the valve needle off the valve seat to enable opening of the injector in response to longitudinal expansion of the piezoelectric actuator. Another example of such a fuel injector is described in EP0995901.

FIG. 1 is a perspective view of a known design of piezoelectric actuator 2. The actuator is formed from a stack of a plurality of piezoelectric layers or elements 4 that are separated by a plurality of internal electrodes 6, 8. FIG. 1 is illustrative only and in practice the actuator 2 would include a greater number of layers and electrodes (typically in the order of hundreds) than those shown and with a much smaller spacing. The internal electrodes 6, 8 are divided into two groups: a positive group of electrodes (only two of which are identified at 6) and a negative group of electrodes (only two of which are identified at 8). The positive group of electrodes 6 are interdigitated with the negative group of electrodes 8, with the electrodes of the positive group connecting with a positive external electrode 10 of the actuator 2 and the negative group of electrodes connecting with a negative external electrode (not shown) on the opposite side of the actuator 2 to the positive external electrode 10.

The positive and negative external electrodes receive an applied voltage, in use, that produces an intermittent electric field between adjacent interdigitated internal electrodes 6, 8 that rapidly varies with respect to its strength. Varying the applied field causes the actuator 2 to extend and contract along the direction of the applied field. Typically, the piezoelectric material from which the elements 4 are formed is a ferroelectric material such as lead zirconate titanate, which is known by those skilled in the art as PZT. The actuator construction results in the presence of active regions between internal electrodes of opposite polarity. In use, when a voltage is applied across the external electrodes, the active regions are caused to expand resulting in an extension of the longitudinal axis of the actuator 2.

The high electrical field applied to the elements causes a risk of electrical shorting between the side edges of the internal electrodes of opposite polarity. To prevent such shortening, the exposed electrode faces of the piezoelectric multilayer element are preferably covered with a passivation material exhibiting high dielectric strength.

Passivation of the piezoelectric element guards against electrical shorting across the surface of the actuator as long as the actuator is operated in a dry and fuel free environment.

SUMMARY OF THE INVENTION

It is against the above background that the invention provides a piezoelectric actuator comprising a stack of one or more piezoelectric elements, the stack defining an external surface, and passivation means applied to the external surface of the stack, wherein the passivation means includes a self-supporting polyimide material (e.g. in the form of a layer, film or membrane).

Polyimide offers high dimensional stability and mechanical/electrical properties at extremes of temperatures. In particular, the glass transition temperature of polyimide is approximately 400 degrees Celsius. Due to the relatively high glass transition temperature, the actuator of the invention is particularly suited for use within automotive fuel injection equipment since the operating temperature of the equipment is not so high as to degrade the physical, electrical or mechanical properties of the passivation means. A further benefit of the polyimide layer is that polyimide exhibits relatively high dielectric strength, in the region of more than 100 kV/mm. Thus, the polyimide layer is effective at insulating electrode elements of the actuator so as to avoid electrical shorting. It should be noted that the terms 'membrane', 'film' and 'layer' used herein are synonymous.

In the preferred embodiment of the invention, the actuator is located within a chamber of a fuel injector containing high pressure fuel such that substantially the entire external surface of the stack is exposed to an aggressive chemical environment. Thus, in these circumstances, the passivation means preferably is configured to cover substantially all of the external surface of the stack that is exposed to the environment, that is to say the body of the actuator and the external electrodes.

The polyimide film may take the form of a relatively narrow ribbon-like or tape-like film that is wound around the external surface of the stack. In this way, overlapping the polyimide tape during winding increases the thickness of the passivation means.

Alternatively, the polyimide film may be in the form of a sheet having a width substantially equal to the length of the actuator.

In order to increase the adhesion of the passivation means to the external surface of the stack, a bonding layer may be disposed intermediate the polyimide layer and the stack surface.

To further improve the protective properties of the passivation means, there may be included a further protective layer, preferably in the form of a fluoroethylene-propylene (FEP) film or coating applied to the polyimide layer. Thus, a first layer acts as adhesive, a second layer acts as passivation material and a third layer acts as fuel and moisture barrier. The moisture fuel barrier function is particularly suitable in applications where the actuator is completely surrounded by high pressure diesel fuel.

Alternatively, the further protective layer may be a coating or film selected from the group comprising polyetherketones, polyetheretherketones, polybenzimidazoles, polyphenylensulfides, polyamidimides, polysulfones, polyethersulfones or liquid crystalline polymers.

Advantageously, the invention provides an effective passivation function of the surface of the actuator, protection against the environment and from contamination and increased robustness against fuel and water permeation which improves the reliability of the actuator.

The invention also encompasses a fuel injector incorporating a piezoelectric actuator as described above.

BRIEF DESCRIPTION OF THE DRAWINGS

Reference has already been made to FIG. 1 which shows a perspective view of a piezoelectric actuator. In order for the invention to be more readily understood, reference will now be made to the following drawings in which.

DETAILED DESCRIPTION OF THE PREFERRED EMBODIMENTS

Figure 1:
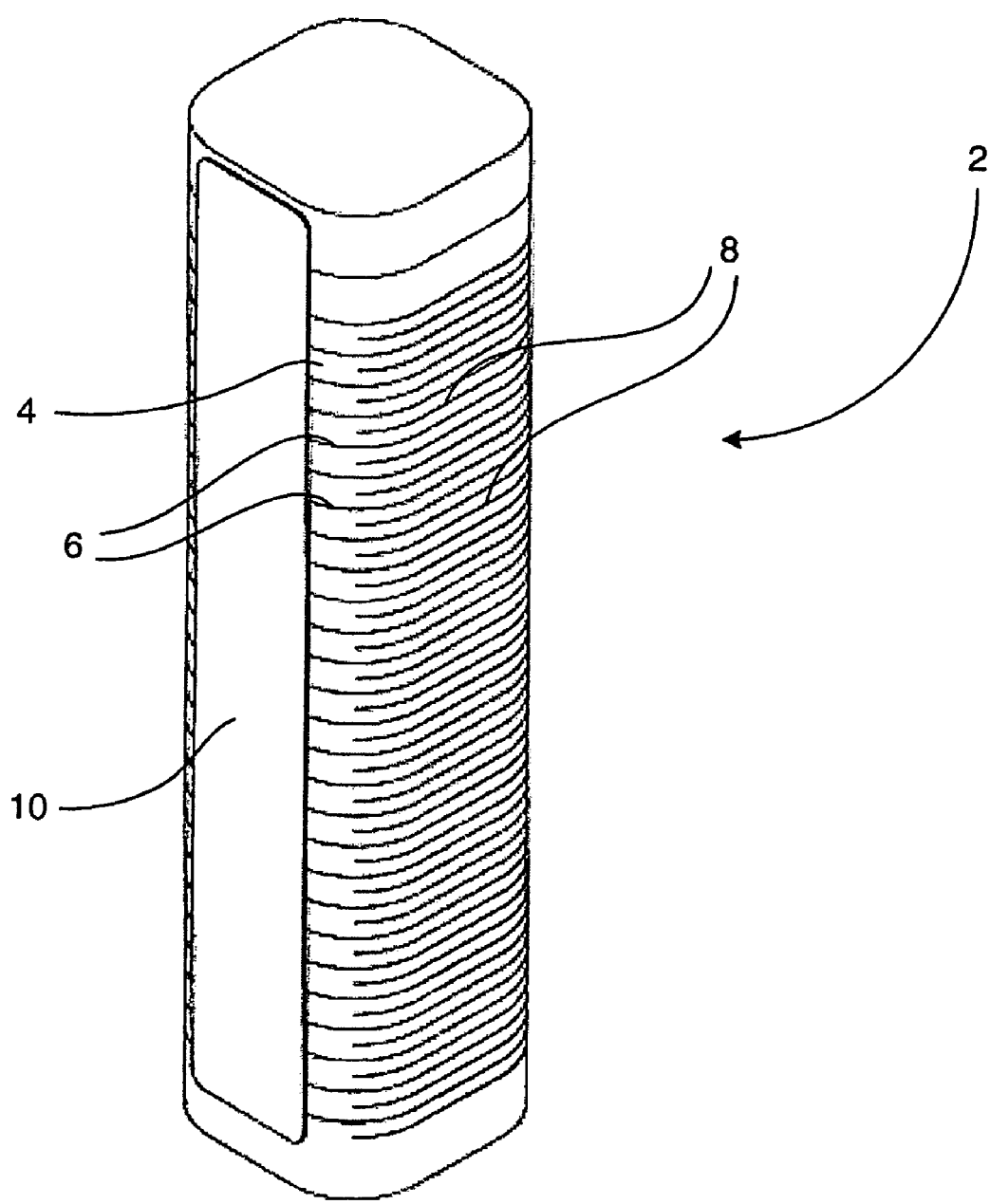
Figure 2:
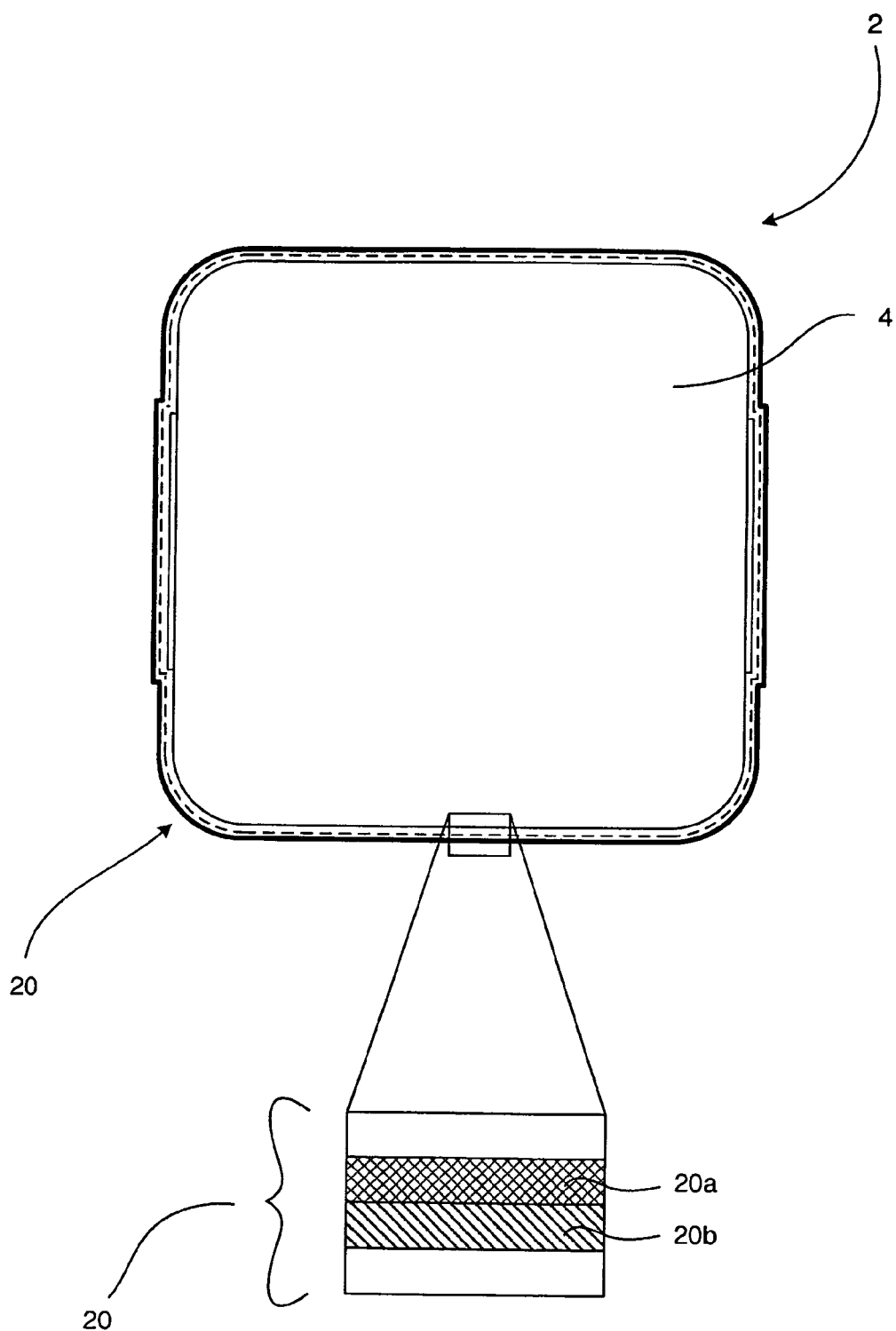
FIG. 2 is a cross section view of an actuator like that of FIG. 1 and bearing a passivation means in accordance with an embodiment of the invention.

In FIG. 2, in order to protect the actuator 2 from the aggressive chemical environment in which it is to be used, the actuator 2 is provided with a passivation means 20 that is arranged to cover substantially the entire surface of the actuator 2.

The passivation means 20 comprises two layers: an adhesive layer 20a and a protective barrier or 'passivation' layer 20b. The adhesive layer 20a is provided immediately adjacent the surface of the actuator 2, and intermediate the barrier layer 20b. The bonding layer 20a provides a means to fix the barrier layer 20b to the actuator 2 and is preferably in the form of an epoxy glue having a high temperature stability and low ionic content so as to be electrically resistive. For example, the adhesive layer 20a may be composed of a silicone, fluorosilicone, acrylic or epoxy based adhesive. The adhesive layer thickness should be less than about 100 μm.

During construction of the actuator 2, the adhesive layer 20a may be applied either on the surface of the actuator or, alternatively, on the passivation layer 20b. In order to ensure proper adhesion between the surface of the actuator 2 and the passivation layer 20b, the adhesive layer 20a may be applied on the entire surface of the actuator 2 or, alternatively, the entire surface of the passivation layer 20b. Alternatively, the adhesive layer 20a can be applied only at the ends of the actuator 2 or the passivation layer 20b, thus avoiding electrically active areas of the actuator 2 that may be beneficial in some circumstances. It should be appreciated that the adhesive layer 20a may also be applied on the external electrode 10.

The passivation layer 20b is formed from a thermoplastic polymer material in the form of a self-supporting polyimide film. The polymer film can be prepared by extrusion or casting. In a preferred embodiment the film should be made out of Polyimide such as Kapton® from DuPont.

In order to construct the passivation means 20 so as to protect the actuator 2, a tape-like film of combined polyimide and silicone or epoxy adhesive is formed prior to applying the film to the actuator 2. The polyimide tape is then wound completely around the actuator 2 so as to form the passivation means 20. In this way, the thickness of the passivation means can be increased either by overlapping the tape layers as many times as desired or, alternatively, by applying a second layer after the application of the first layer.

In an alternative embodiment, the passivation means 20 is formed from a sheet of self-supporting polyimide film having a width substantially equal to, or slightly greater than the axial length of the actuator 2 and a length substantially equal to the circumference of the actuator 2. In circumstances in which the sheet of polyimide film has a width greater than the axial length of the actuator, the film extends beyond the upper and lower ends of the actuator and, in such a scenario the adhesive may be applied solely outside the axial length and around the circumference of the actuator. In such a configuration it is preferable that no adhesive contacts active regions of the actuator 2.

Figure 3:
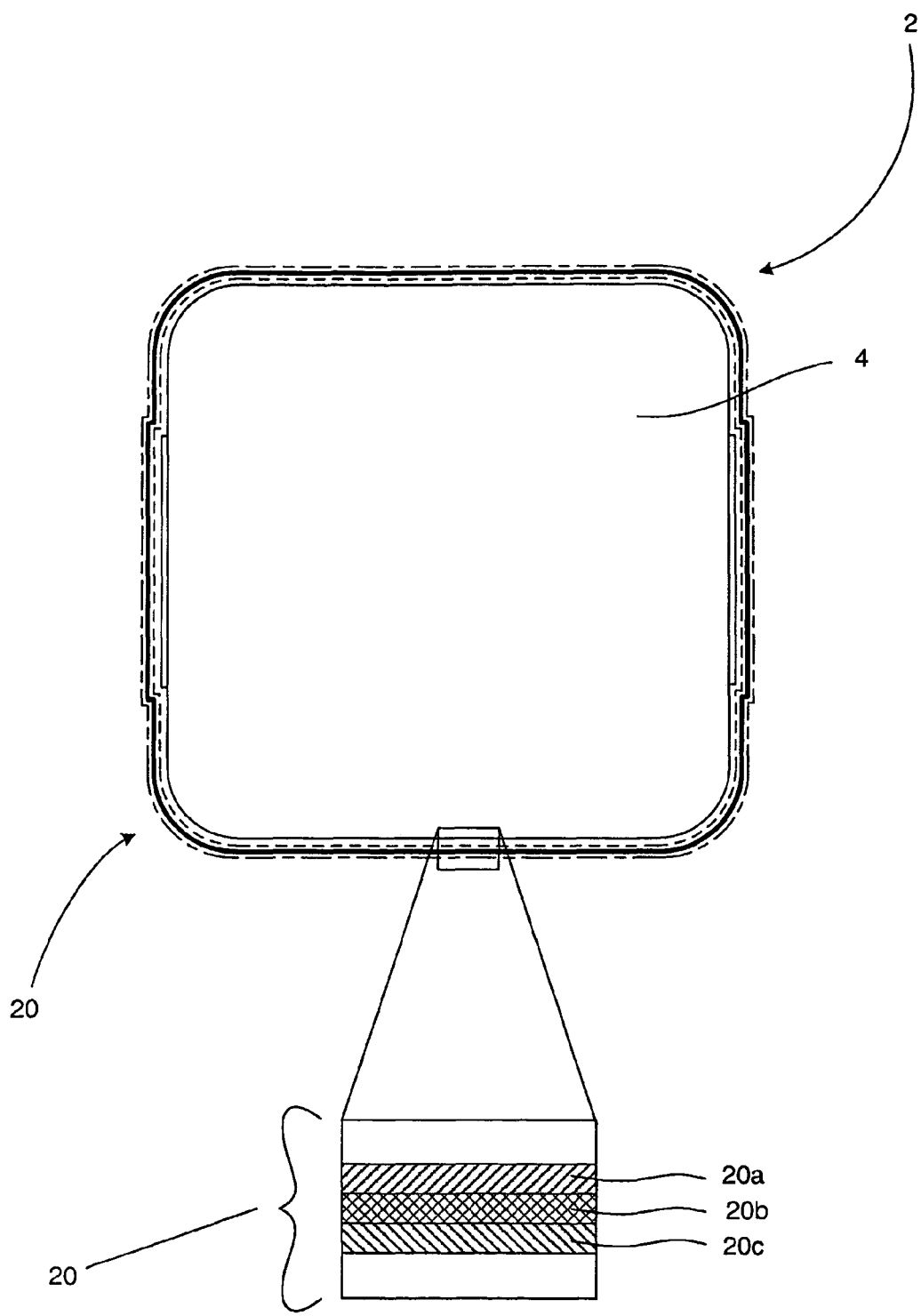
FIG. 3 is a cross section view of an alternative embodiment of the invention.

In an alternative embodiment of the invention, as shown in FIG. 3, a further protective layer 20c in the form of a fluoroethylene-propylene (FEP) fluoropolymer coating is applied on the outer surface of the passivation layer 20b, thus serving as an additional barrier to water and hydrocarbon-based fuels. The further layer 20c may also be formed as a film that is laminated with the passivation layer 20b prepared by co-extrusion prior to being applied to the actuator 2.

Although it is preferred that the further layer 20c is an FEP fluroropolymer, it may also be formed from semi-crystalline thermoplastics such as, polyetherketones, polyetheretherketones, polybenzimidazoles, polyphenylensulfides, polyamidimides, polysulfones, polyethersulfones or liquid crystalline polymers.

Further protective layers of this or another material may be applied also to further improve the resilience of the actuator 2 to the environment in which it is located, in use. For example, a single or dual walled polymeric heat-shrink material may be applied so as to encapsulate the actuator.

The invention claimed is:

1. A piezoelectric actuator comprising:
   a stack of piezoelectric elements defining an external surface, and
   a passivation arrangement applied to the external surface of the stack,
   wherein the passivation arrangement includes a layer of self-supporting polyimide film and a further protective layer in the form of a fluoroethylene-propylene coating or film applied to the polyimide film layer.

2. The piezoelectric actuator of claim 1, wherein the polyimide film layer and the further protective layer are laminated prior to being applied to the actuator.

3. The piezoelectric actuator of claim 1, wherein the passivation arrangement is arranged to cover the entire external surface of the actuator that is exposed to a moisture bearing environment, in use.

4. The piezoelectric actuator of claim 1, wherein a bonding layer is disposed intermediate the polyimide film layer and the external surface of the actuator.

5. The piezoelectric actuator of claim 4, wherein the bonding layer is applied only at the ends of the actuator so as to avoid electrically active area of the actuator.

6. The piezoelectric actuator of claim 4, wherein the self-supporting polyimide film layer extends beyond upper and lower ends of the actuator and the bonding layer is applied only to the areas of the polyimide film layer that extend beyond said upper and lower ends.

* * * * *